(12) United States Patent
Ren et al.

(10) Patent No.: US 7,659,583 B2
(45) Date of Patent: Feb. 9, 2010

(54) ULTRATHIN SOI CMOS DEVICES EMPLOYING DIFFERENTIAL STI LINERS

(75) Inventors: Zhibin Ren, Hopewell Junction, NY (US); Ghavam Shahidi, Pound Ridge, NY (US); Dinkar V. Singh, Chicago, IL (US); Jeffrey W. Sleight, Ridgefield, CT (US); Xinhui Wang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 296 days.

(21) Appl. No.: 11/839,272

(22) Filed: Aug. 15, 2007

(65) Prior Publication Data

US 2009/0045462 A1 Feb. 19, 2009

(51) Int. Cl.
*H01L 27/01* (2006.01)
*H01L 27/12* (2006.01)
*H01L 31/0392* (2006.01)

(52) U.S. Cl. ............... 257/351; 257/370; 257/378; 438/199; 438/204

(58) Field of Classification Search ........... 257/351, 257/370, 378, E21.632, E27.111; 438/199, 438/204
See application file for complete search history.

(56) References Cited

U.S. PATENT DOCUMENTS

| 7,547,641 B2 * | 6/2009 | Ieong et al. ............. 438/739 |
| 2005/0148133 A1 * | 7/2005 | Chen et al. ............. 438/199 |

* cited by examiner

*Primary Examiner*—Phuc T Dang
(74) *Attorney, Agent, or Firm*—Scully, Scott, Murphy & Presser, P.C.; Vazken Alexanian

(57) ABSTRACT

An oxynitride pad layer and a masking layer are formed on an ultrathin semiconductor-on-insulator substrate containing a top semiconductor layer comprising silicon. A first portion of a shallow trench is patterned in a top semiconductor layer by lithographic masking of an NFET region and an etch, in which exposed portions of the buried insulator layer is recessed and the top semiconductor layer is undercut. A thick thermal silicon oxide liner is formed on the exposed sidewalls and bottom peripheral surfaces of a PFET active area to apply a high laterally compressive stress. A second portion of the shallow trench is formed by lithographic masking of a PFET region including the PFET active area. A thin thermal silicon oxide or no thermal silicon oxide is formed on exposed sidewalls of the NFET active area, which is subjected to a low lateral compressive stress or no lateral compressive stress.

12 Claims, 15 Drawing Sheets

ULTRATHIN SOI CMOS DEVICES EMPLOYING DIFFERENTIAL STI LINERS

FIELD OF THE INVENTION

The present invention generally relates to semiconductor devices for integrated circuits, and particularly to CMOS transistors having enhanced performance through stress engineering of shallow trench isolation liners and methods of manufacturing the same.

BACKGROUND OF THE INVENTION

Thermal oxidation of silicon converts a portion of exposed silicon into thermal silicon oxide as oxygen atoms diffuse into the silicon material. The volume of the resulting thermal silicon oxide is greater than the volume of the initial silicon region since the incorporated oxygen atoms induce volume expansion, which applies a compressive stress to the remaining silicon material.

Use of thermal silicon oxide as a liner in shallow trench isolation is known the in the art. Referring to FIG. 1, an exemplary prior art structure comprises a semiconductor substrate 8, a p-type field effect transistor (PFET) region 100, and an n-type field effect transistor (NFET) region 200. The semiconductor substrate 8 is a semiconductor-on-insulator substrate containing a handle substrate 10, a buried insulator layer 20, and a top semiconductor layer 30. The top semiconductor layer 30 comprises a PFET active area 22, an NFET active area 24, and a boundary semiconductor region 26, each of which is separated from the rest by shallow trench isolation 62 and a thermal silicon oxide liner 51 having a thickness t0. A PFET comprises the PFET active area 22 and the collection of a gate dielectric 70, a gate conductor 72, and a gate spacer 74 thereupon within the PFET region 100. Likewise, an NFET comprises the NFET active area 24 and the collection of a gate dielectric 70, a gate conductor 72, and a gate spacer 74 thereupon within the NFET region 200.

Since the thermal silicon oxide liner 51 has the same thickness t0 throughout the exemplary prior art structure, the PFET active area 22 and the NFET active area 24 are subjected to the same lateral compressive stress effect due to the thermal silicon oxide liner 51. While the level of lateral compressive stress is determined by the size and geometry of the PFET active area 22 and the NFET active area 24 and the thickness of the thermal silicon oxide liner 51, the mechanism for generation of the lateral compressive stress is the same across the PFET region 100 and the NFET region 200. Thus, for a PFET active area 22 and an NFET active area 24 having identical geometry, the magnitude and the direction of the lateral compressive stress is the same.

When stress is applied to the channel within an active area of a semiconductor transistor, the mobility of carriers, and as a consequence, the transconductance and the on-current of the transistor are altered from their corresponding values for a transistor containing an unstressed semiconductor. This is because the applied stress and the resulting strain on the semiconductor structure within the channel affects the band gap structure (i.e., breaks the degeneracy of the band structure) and changes the effective mass of carriers. The effect of the stress depends on the crystallographic orientation of the plane of the channel, the direction of the channel within the crystallographic orientation, and the direction of the applied stress.

The effect of uniaxial stress, i.e., a stress applied along one crystallographic orientation, on the performance of semiconductor devices, especially on the performance of a metal-oxide-semiconductor field effect transistor (MOSFET, or a "FET" in short) device built on a silicon substrate, has been extensively studied in the semiconductor industry. For a p-type MOSFET (PMOSFET, or a "PFET" in short) utilizing a silicon channel, the mobility of minority carriers in the channel (which are holes in this case) increases under uniaxial compressive stress along the direction of the channel, i.e., the direction of the movement of holes or the direction connecting the drain to the source. Conversely, for an n-type MOSFET (NMOSFET, or an "NFET" in short) devices utilizing a silicon channel, the mobility of minority carriers in the channel (which are electrons in this case) increases under uniaxial tensile stress along the direction of the channel, i.e., the direction of the movement of electrons or the direction connecting the drain to the source. These opposite requirements for the type of stress for enhancing carrier mobility between the PMOSFETs and NMOSFETs have led to prior art methods for applying at least two different types of stress to the semiconductor devices on the same integrated chip.

Typical MOSFET devices have an active area in the shape of a rectangular block having a length in the direction of a channel and a width in the direction perpendicular to the direction of the channel, in which the width is greater than the length. A thermal silicon oxide liner surrounding the active area of a PMOSFET applies a laterally compressive stress along the direction of the channel of the PMOSFET, and thus advantageous to performance of the PMOSFET through enhancement of hole mobility and on-current of the PMOSFET. The thermal silicon oxide liner surrounding the active area of an NMOSFET also applies a laterally compressive stress along the direction of the channel of the NMOSFET. However, the lateral compressive stress is disadvantageous to the performance of the NMOSFET through degradation of electron mobility and reduction of on-current of the NMOSFET.

In view of the above, there exists a need for a semiconductor structure that provides the advantageous effects of a thermal silicon oxide liner on a PMOSFET, while minimizing the adverse effects of the thermal silicon oxide liner on an NMOSFET, and methods of manufacturing the same.

Also, there exists a need for a semiconductor structure providing such benefits described above on a PMOSFET and an NMOSFET formed on an ultrathin semiconductor-on-insulator substrate and methods of manufacturing the same.

Also, there exists a need for a semiconductor structure in which the lateral compressive stress on the PMOSFET is at a high level to advantageously affect the performance of the PMOSFET, while avoiding an adverse effect on the performance of the NMOSFET.

SUMMARY OF THE INVENTION

The present invention addresses the needs described above by providing an ultrathin semiconductor-on-insulator semiconductor structure containing a PMOSFET having a thick thermal silicon oxide liner on a PFET active region and an NMOSFET having a thin thermal silicon oxide liner or no thermal silicon oxide liner on an NFET active region, and methods of manufacturing the same.

An oxynitride pad layer and a masking layer are formed on an ultrathin semiconductor-on-insulator substrate containing a top semiconductor layer comprising silicon. The masking layer is lithographically patterned for shallow trench isolation. A first portion of a shallow trench is patterned in the top semiconductor layer by lithographic masking of an NFET region and an etch, in which exposed portions of the buried insulator layer is recessed and the top semiconductor layer is undercut. The etch forms a PFET active area surrounded by the first portion of the shallow trench. A thick thermal silicon oxide liner is formed on the exposed sidewalls and bottom peripheral surfaces of the PFET active area to apply a high laterally compressive stress. A second portion of the shallow trench is formed by lithographic masking of a PFET region including the PFET active area. The etch forms an NFET active area surrounded by the second portion of the shallow trench. The etch does not recess the buried oxide layer. A thin thermal silicon oxide or no thermal silicon oxide is formed on exposed sidewalls of the NFET active area, which is subjected to a low lateral compressive stress or no lateral compressive stress. Shallow trench isolation is formed in the shallow trench, followed by formation of a PFET in the PFET region and an NFET in the NFET region. The PFET benefits from the laterally compressive stress of the thick thermal silicon oxide liner, while the adverse effect of compressive stress from a thermal silicon oxide liner is minimized or eliminated on the NFET.

According to an aspect of the present invention, a semiconductor structure is provided, which comprises:

a p-type field effect transistor (PFET) including a PFET active area, wherein the PFET active area contains a PFET channel and is located directly on a buried insulator layer of a semiconductor-on-insulator substrate;

an n-type field effect transistor (NFET) including an NFET active area, wherein the NFET active area contains an NFET channel and is located directly on the buried insulator and is disjoined from the PFET active area;

a thermal silicon oxide layer located directly on sidewalls and bottom peripheral surfaces of the PFET active area, wherein a portion of the thermal silicon oxide layer on the sidewall of the PFET active area has a first thickness; and another thermal silicon oxide layer located directly on sidewalls of the NFET active area, wherein a portion of the thermal silicon oxide layer on the sidewall of the NFET active area has a second thickness, and wherein the first thickness is greater than the second thickness.

In one embodiment, a vertical cross-sectional area of the thermal silicon oxide layer is L-shaped.

In another embodiment, the semiconductor structure further comprises shallow trench isolation comprising a dielectric material and abutting the thermal silicon oxide layer and the another thermal silicon oxide layer.

In even another embodiment, the buried insulator layer has a recessed portion having a recessed surface extending from the bottom peripheral surface of the PFET active area to a recess depth below an interface between the PFET active area and the buried insulator layer, and wherein the thermal silicon oxide layer abuts a portion of the recessed surface.

In still another embodiment, the thermal silicon oxide layer applies a first laterally compressive stress on the PFET channel and the another thermal silicon oxide layer applies a second laterally compressive stress on the NFET channel, wherein the magnitude of the first laterally compressive stress is greater than the magnitude of the second laterally compressive stress.

According to another aspect of the present invention, a semiconductor structure is provided, which comprises:

a p-type field effect transistor (PFET) including a PFET active area, wherein the PFET active area contains a PFET channel and is located directly on a buried insulator layer of a semiconductor-on-insulator substrate;

an n-type field effect transistor (NFET) including an NFET active area, wherein the NFET active area contains an NFET channel and is located directly on the buried insulator and is disjoined from the PFET active area;

a thermal silicon oxide layer located directly on sidewalls and a bottom peripheral surface of the PFET active area; and shallow trench isolation comprising a dielectric material and laterally abutting the thermal silicon oxide layer and sidewalls of the NFET active area.

In one embodiment, a vertical cross-sectional area of the thermal silicon oxide layer is L-shaped.

In another embodiment, the buried insulator layer has a recessed portion having a recessed surface extending from the bottom peripheral surface of the PFET active area to a recess depth below an interface between the PFET active area and the buried insulator layer, and wherein the thermal silicon oxide layer abuts a portion of the recessed surface.

In still another embodiment, the thermal silicon oxide layer applies a laterally compressive stress on the PFET channel. In this case, the thermal oxide layer is not present in the NFET active area and therefore, the NFET channel is free of a laterally compressive stress from the thermal oxide layer.

According to yet another aspect of the present invention, a method of forming a semiconductor structure is provided, which comprises:

forming a masking layer on a semiconductor-on-insulator substrate including a buried insulator layer and a top semiconductor layer;

etching a portion of the top semiconductor layer and forming a PFET active area in a PFET region of the top semiconductor layer;

recessing a top surface of the buried insulator layer and undercutting the buried insulator layer directly beneath the PFET active area to expose a bottom peripheral surface of the PFET active area;

forming a thermal silicon oxide layer directly on sidewalls and the bottom peripheral surface of the PFET active area; and etching another portion of the top semiconductor layer and forming an NFET active area in an NFET region of the semiconductor layer, wherein the NFET region is disjoined from the PFET region.

In one embodiment, a vertical cross-sectional area of the thermal silicon oxide layer is L-shaped.

In another embodiment, the method further comprises forming shallow trench isolation comprising a dielectric material directly on the thermal silicon oxide layer and the NFET active area.

In even another embodiment, the method further comprises forming another thermal oxide layer directly on sidewalls of the NFET active area, wherein a portion of the thermal silicon oxide layer located directly on the sidewalls of the PFET active area has a first thickness, a portion of the another thermal silicon oxide layer on the sidewalls of the NFET active area has a second thickness, and the first thickness is greater than the second thickness.

In still another embodiment, a portion of the thermal silicon oxide layer located directly on the sidewalls of the PFET active area has a first thickness, another portion of the thermal silicon oxide layer located directly on the bottom peripheral surface of the PFET active area has a bottom oxide thickness, and the first thickness is substantially the same as the bottom oxide thickness.

In a further embodiment, the method further comprises forming an oxynitride layer directly on the top semiconductor layer prior to forming the masking layer, wherein the oxynitride layer prevents oxidation of a portion of the semiconductor layer directly beneath the oxynitride during the forming of the thermal silicon oxide layer.

DETAILED DESCRIPTION OF THE INVENTION

Figure 1:
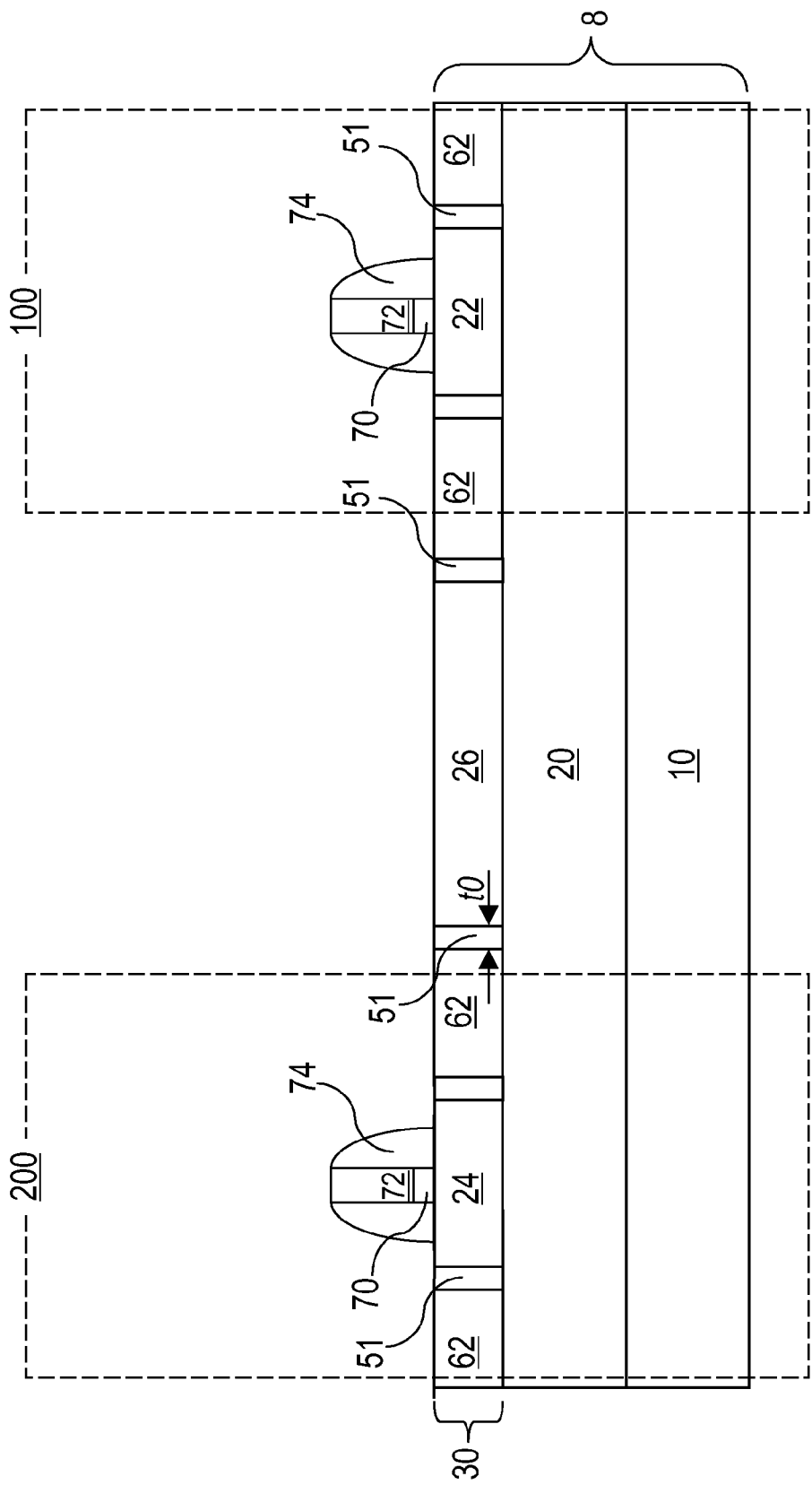
FIG. 1 is a vertical cross-sectional view of an exemplary prior art structure containing a thermal silicon oxide liner of homogeneous thickness on shallow trench isolation.

As stated above, the present invention relates to CMOS transistors having enhanced performance through stress engineering of shallow trench isolation liners and methods of manufacturing the same, which are now described in detail with accompanying figures. It is noted that like and corresponding elements are referred to by like reference numerals.

Figure 2:
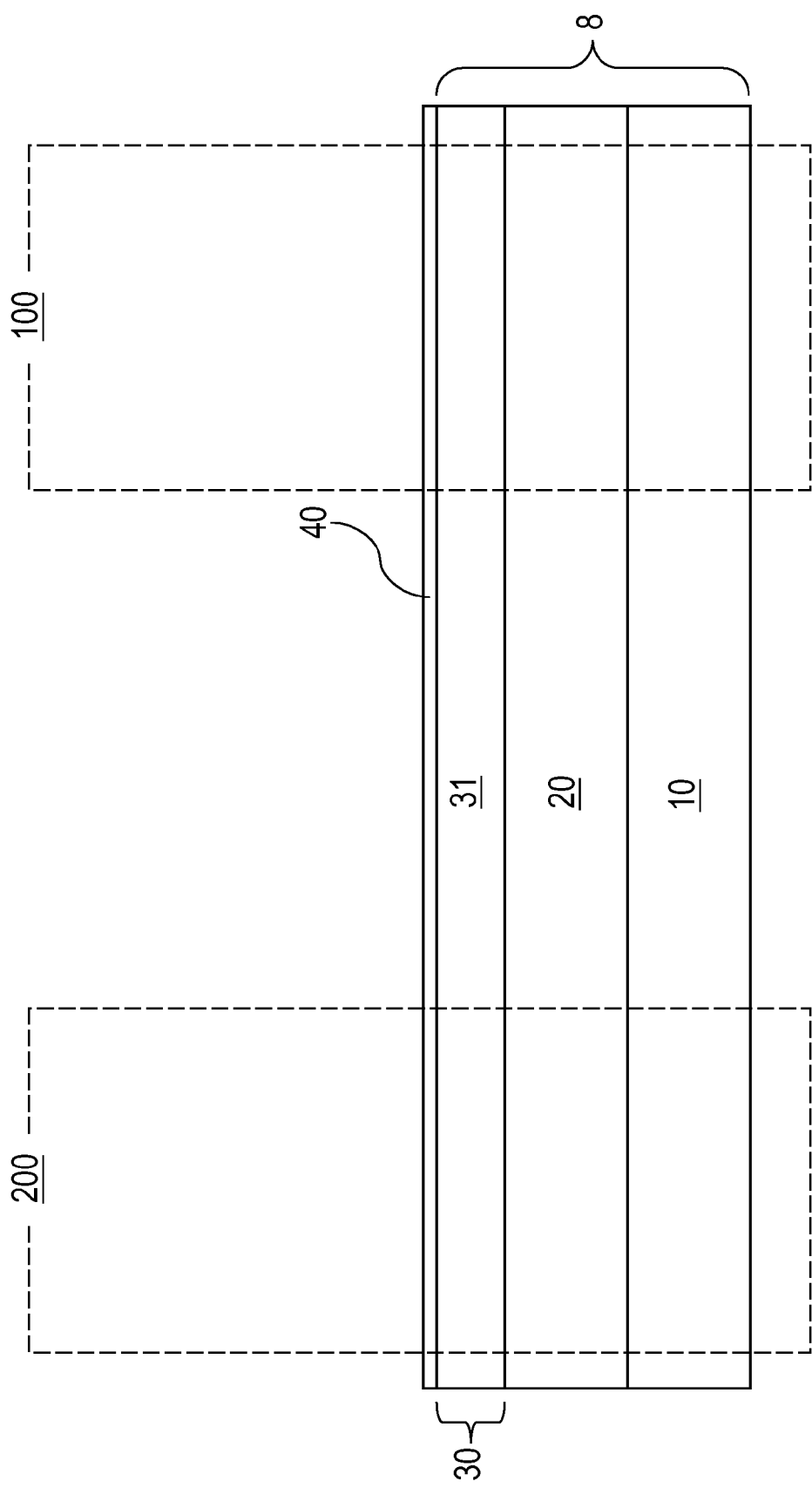
FIGS. 2-10 are sequential vertical cross-sectional views of a first exemplary semiconductor structure.

Referring to FIG. 2, a first exemplary semiconductor structure according to a first embodiment of the present invention comprises a semiconductor substrate 8, a p-type field effect transistor (PFET) region 100, and an n-type field effect transistor (NFET) region 200. The semiconductor substrate 8 is a semiconductor-on-insulator substrate containing a handle substrate 10, a buried insulator layer 20, and a top semiconductor layer 30. The top semiconductor layer 30 comprises a semiconductor region 31, which, at this point, is not patterned. The thickness of the top semiconductor layer 20 is from about 5 nm to about 30 nm, and preferably from about 8 nm to about 18 nm. A top semiconductor layer having such a thickness is typically called an ultrathin semiconductor-on-insulator (UTSOI) layer. The PFET region 100 and the NFET region 200 are two disjoined regions of the semiconductor substrate 8 and structures thereupon in which a PFET and an NFET is subsequently formed, respectively.

The handle substrate 10 may comprise a semiconductor material, an insulator material, or a metal. Typically, the handle substrate 10 comprises a semiconductor material such as silicon. The buried insulator layer 20 comprises a dielectric material such as silicon oxide or silicon nitride. The thickness of the buried insulator layer 20 may be from about 20 nm to about 400 nm, and typically from about 100 nm to about 200 nm. The semiconductor region 31 comprises silicon. The semiconductor region 31 may substantially consist of silicon. Alternately, the semiconductor region may further contain carbon or germanium at a low atomic concentration, i.e., in the range from 0% to about 5%, to alter the lattice constant of silicon. The semiconductor region 31 may be doped with electrical dopants such as B, Ga, In, P, As, and/or Sb at a dopant concentration from about $1.0 \times 10^{15}/cm^3$ to about $3.0 \times 10^{19}/cm^3$, and typically at a doping concentration from about $1.0 \times 10^{16}/cm^3$ to about $1.0 \times 10^{18}/cm^3$. Further, implementation of the present invention on a hybrid substrate containing a bulk portion and an SOI portion is also explicitly contemplated herein.

A pad layer 40 is formed directly on the top semiconductor layer 30. The pad layer 40 may be an oxynitride layer formed by a combination of thermal oxidation of the top semiconductor layer 30 followed by nitridation. During the thermal oxidation, the top semiconductor layer 30 is exposed to an oxidizing ambient such as $H_2O$ or $O_2$ at an elevated temperature from about 550° C. to about 1,100° C. to form a thermal oxide layer. During nitridation, the surface of the thermal oxide layer is treated with a nitridating agent such as ammonia so that nitrogen atoms accumulate near a top surface and near a bottom surface of the thermal oxide layer to form the oxynitride layer. The thickness of the pad layer may be from about 1 nm to about 10 nm, and typically from about 2 nm to about 4 nm. Alternately, the pad layer 40 may be a stack of an oxide layer and a nitride layer, each having a thickness from about 1 nm to about 4 nm, and typically about 2 nm.

Figure 3:
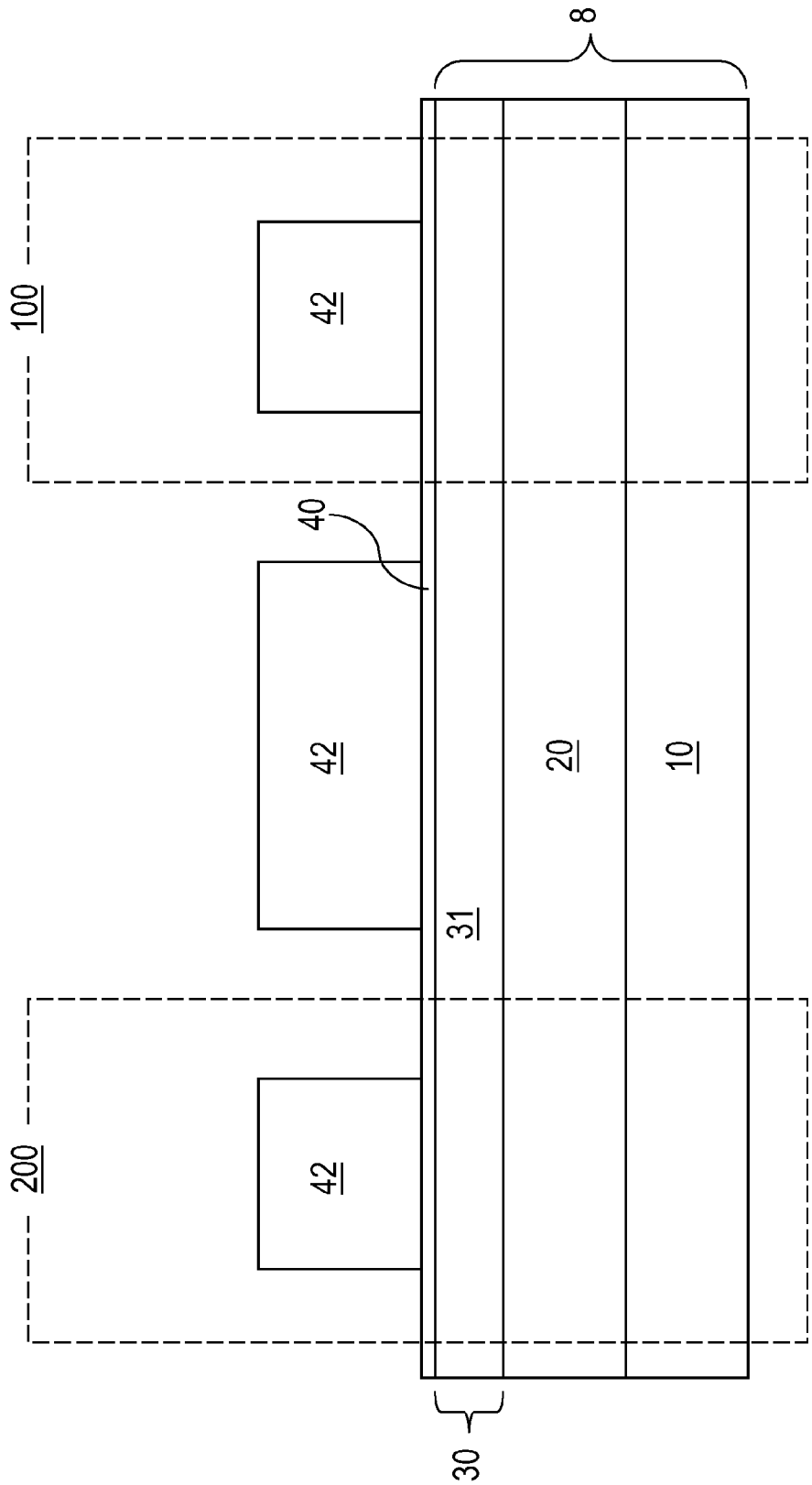

Referring to FIG. 3, a masking layer 42 is formed directly on the pad layer 40 and lithographically patterned. The masking layer 42 may comprise a dielectric material such as silicon nitride. Preferably, the masking layer 42 is resistant to oxidation. The masking layer 42 may be deposited on the pad layer 40, for example, by low pressure chemical vapor deposition (LPCVD), rapid thermal chemical vapor deposition (RTCVD), plasma enhanced chemical vapor deposition (PECVD), and or high density plasma chemical vapor deposition (HDPCVD). The thickness of the masking layer 42 may be from about 50 nm to about 200 nm, and typically from about 90 nm to about 150 nm. Areas of remaining portions of the masking layer 42 as seen in a top-down view after the patterning of the masking layer 42 correspond to active areas to be subsequently formed in the top semiconductor layer 30, while the complementary area correspond to shallow trench isolation to be subsequently formed. One remaining portion of the masking layer 42 is located in the PFET region 100, and another portion of the masking layer 42 is located in the NFET region 200.

Figure 4:
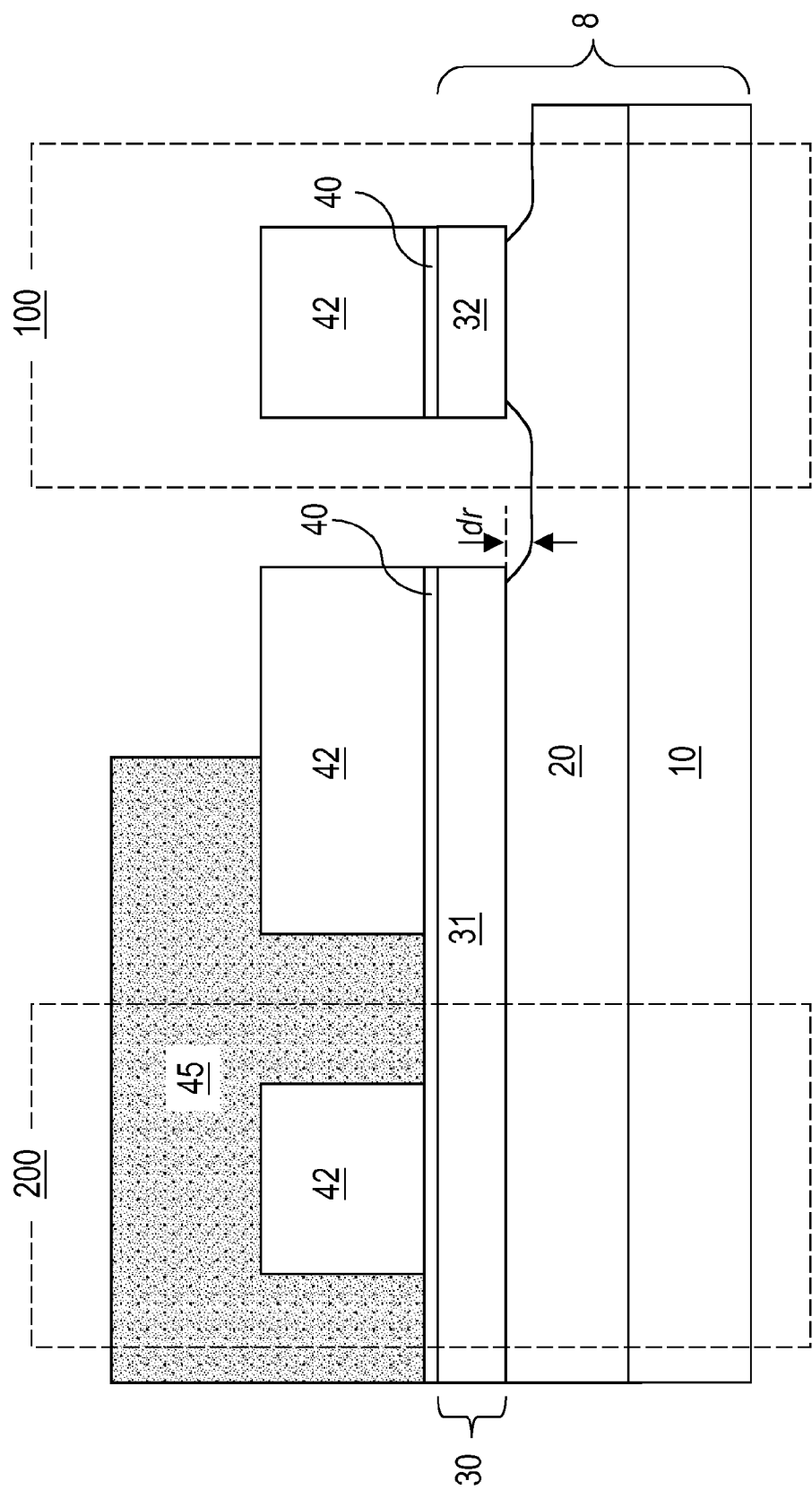

Referring to FIG. 4, a first photoresist 45 is applied on the masking layer 42 and lithographically patterned to expose the masking layer 42 and the pad layer 40 in the PFET region 100, while covering the masking layer 42 and the pad layer 40 in the NFET region 200. An edge of the pattered first photoresist 45 may be located on a portion of the masking layer 42 between the PFET region 100 and the NFET region 200.

An etch is performed employing the first photoresist 45 and the masking layer 42 as an etch mask to remove exposed portions of the pad layer 40 and the semiconductor region 31. The etch is preferably a reactive ion etch. A portion of the semiconductor region 31 underneath the portion of the masking layer in the PFET region 100 is isolated from the rest of the semiconductor region 31. The isolated portion of the semiconductor region 31 in the PFET region 100 is herein referred to as a PFET active area 32. The term, the semiconductor region 31, herebelow excludes the PFET active area 32.

The reactive ion etch exposes a top surface of the buried insulator layer 20 at an interface between the top semiconductor layer 30 and the buried insulator layer 20. The reactive ion etch proceeds further to recess the top surface of the buried insulator layer 20 by a recess depth dr, which may be from about 1 nm to about 5 nm, and typically from about 1.5 nm to about 4 nm. Further, the portions of the buried insulator layer directly beneath sidewalls of the PFET active area and the semiconductor region 31 are laterally undercut by a lateral undercut dimension from about 0.5 nm to about 6 nm, and typically from about 1.5 nm to about 4 nm. A bottom peripheral surface of the PFET active area 32 adjoining sidewalls of the PFET active area 32 is exposed. Another bottom peripheral surface of the semiconductor region 31 adjoining sidewalls of the semiconductor region 31 is also exposed.

Figure 5:
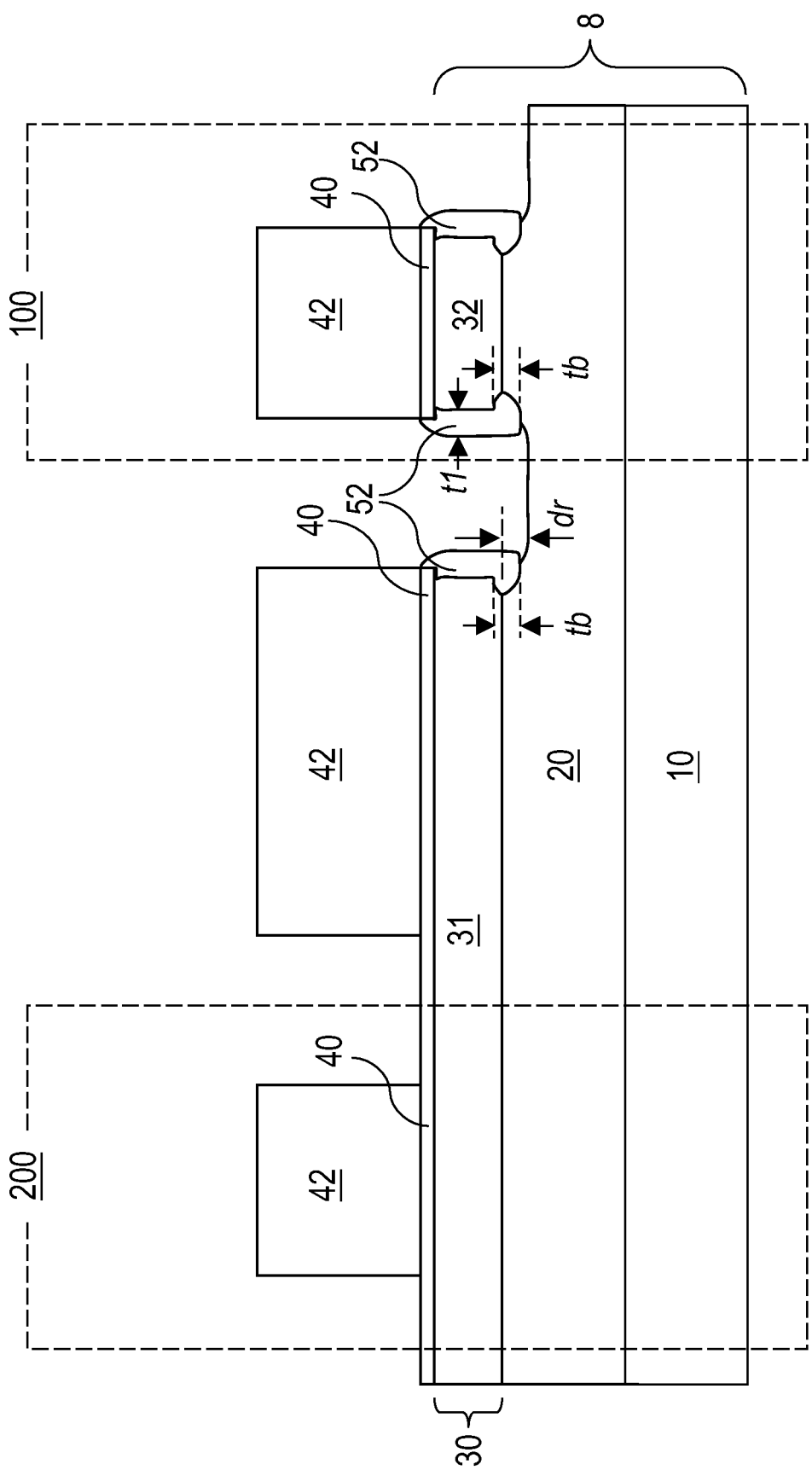

Referring to FIG. 5, the first photoresist 45 is removed, for example, by ashing. A suitable surface clean such as a wet clean may be performed as needed at this step. Thermal oxidation is performed to form a first thermal silicon oxide layer 52 on sidewalls and the exposed bottom peripheral surface of the PFET active area 32 and the semiconductor region 31. The first thermal silicon oxide layer 52 comprises thermal silicon oxide. In some embodiments in which the semiconductor region 31 and the PFET active area 32 contains carbon and/or germanium at the low atomic concentration, the thermal silicon oxide layer 52 may contain some carbon and/or germanium typically at an atomic concentration less than 5%. The thickness of the first thermal silicon oxide layer 52 on sidewalls of the PFET active area 32 and sidewalls of the semiconductor region 31, which is herein referred to as a first thermal silicon oxide layer thickness t1, may be from about 1 nm to about 8 nm, and typically from about 2 nm to about 4 nm. The thickness of the first thermal silicon oxide layer 52 on the bottom peripheral surface of the PFET active area 32 or on the bottom peripheral surface of the semiconductor region 31, which is herein referred to as a bottom oxide thickness tb, may be substantially the same as, or different from, the first thermal silicon oxide layer thickness t1 depending on crystallographic orientations of the PFET active area 32. Preferably, the bottom oxide thickness tb is greater than or equal to the first thermal silicon oxide layer thickness t1, and most preferably, the bottom oxide thickness tb is greater than the first thermal silicon oxide layer thickness t1

Preferably, during the formation of the first thermal silicon oxide layer 52, the pad layer 40 prevents growth of any thermal silicon oxide layer beneath the pad layer 40. In case the pad layer 40 comprises an oxynitride or a stack of oxide layer and a nitride layer, a nitrogen containing portion of the oxynitride or the nitride layer prevents diffusion of oxygen into the semiconductor region 31 inhibiting growth of any thermal silicon oxide layer beneath the pad layer 40.

A portion of the first thermal silicon oxide layer 52 laterally surrounds the PFET active area 32 and applies a first laterally compressive stress to the PFET active area 32. Preferably, the first thermal silicon oxide layer thickness t1 is greater than prior art thicknesses t0 for the prior art thermal silicon oxide layer 51 in the exemplary prior art semiconductor structure (See FIG. 1). The portion of the first thermal silicon oxide layer 52 that laterally surrounds the PFET active area is topologically homeomorphic to a torus, i.e., may be continually stretched and bent into a torus without forming or removing a singularity by creating or destroying a hole in the shape. The vertical cross-sectional area in a vertical cross-sectional view, such as FIG. 5, of the first thermal silicon oxide layer 52 is L-shaped, i.e., has a vertical portion and a laterally protruding portion adjoined to the vertical portion. In other words, the first thermal silicon oxide layer 52 extends from a sidewall of the PFET active area 32 toward the PFET active area 32 along an interface between the buried insulator layer 20 and the PFET active area 32. The length of extension is substantially the same as the lateral undercut dimension, and may be from about 0.5 nm to about 6 nm.

The laterally protruding portion of the of the first thermal silicon oxide layer 52 enhances the laterally compressive stress by effectively increasing a lateral dimension of the first thermal silicon oxide layer 52 at the interface between the PFET active area 32 and the buried insulator layer. Comparing the magnitude of laterally compressive stress between the first exemplary semiconductor of the present invention with the exemplary prior art semiconductor structure of FIG. 1 for identical dimensions of the PFET active area 32 and the prior art PFET active area 22, the magnitude of the laterally compressive stress applied to the PFET active area 32 is enhanced due to the L-shaped profile of the first thermal silicon oxide layer 52 compared to the laterally compressive stress on a prior art PFET active area 22 (See FIG. 1) laterally surrounded by a prior art thermal silicon oxide layer 51 having the same thickness t0 as the first thermal silicon oxide layer thickness t1. Further, unlike the exemplary prior art structure of FIG. 1, the first thermal silicon oxide layer thickness t1 may be increased without regard to adverse effects of a thick silicon oxide liner on an NFET, as will be shown below. Thus, the first exemplary semiconductor structure enhances the laterally compressive stress through the L-shaped profile of the first thermal silicon oxide layer 52, and allows increase in the first thermal silicon oxide layer thickness t1 without adverse impacts thereof on the NFET.

Figure 6:
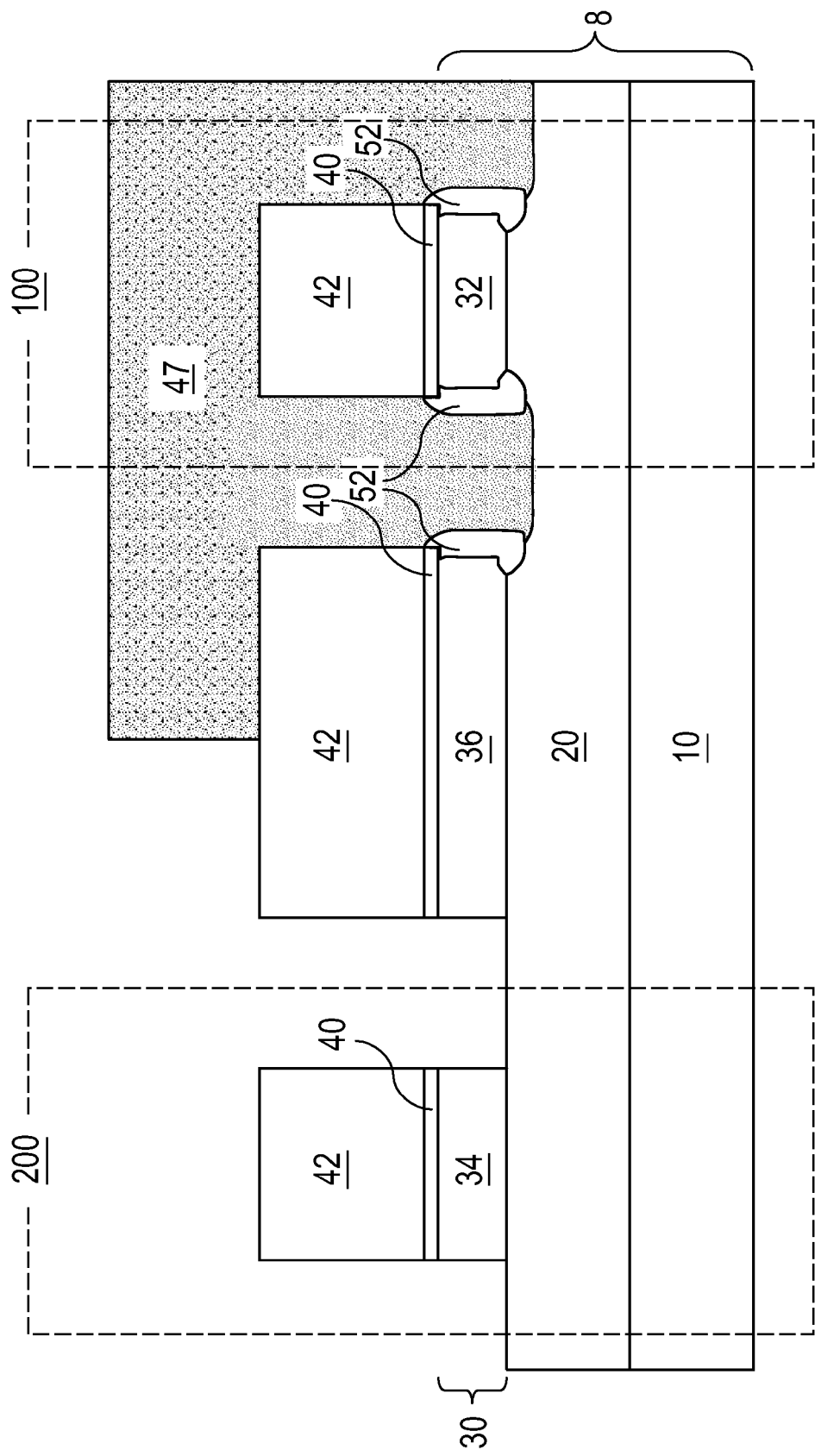

Referring to FIG. 6, a second photoresist 47 is applied on the masking layer 42 and lithographically patterned to expose the masking layer 42 and the pad layer 40 in the NFET region 200, while covering the masking layer 42 and the pad layer 40 in the PFET region 100. An edge of the pattered second photoresist 47 may be located on the portion of the masking layer 42 between the PFET region 100 and the NFET region 200. Preferably, the edge of the patterned second photoresist 47 substantially coincides with the edge of the first patterned photoresist 45 (See FIG. 4), which is not present at this step.

Another etch is performed employing the second photoresist 47 and the masking layer 42 as an etch mask to remove exposed portions of the pad layer 40 and the semiconductor region 31. This etch is preferably a reactive ion etch. A portion of the semiconductor region 31 underneath the portion of the masking layer in the NFET region 200 is isolated from the rest of the semiconductor region 31. The isolated portion of the semiconductor region 31 in the NFET region 200 is herein referred to as a NFET active area 34. The remaining portion of the semiconductor region 31, which is located between the PFET region 100 and the NFET region 200, is herein referred to as a boundary semiconductor region 36.

The reactive ion etch exposes another top surface of the buried insulator layer 20 at the interface between the top semiconductor layer 30 and the buried insulator layer 20. Unlike the reactive ion etch in the step corresponding to FIG. 4, this reactive ion etch is selective to the buried insulator layer 20. Thus, this reactive ion etch stops on the top surface of the buried insulator layer 20. Any overetch into the buried insulator layer 20 is insignificant if present, and is less than 1 nm, and preferably less than 0.5 nm. Thus, there is substantially no overetch is performed into the buried insulator layer 20. Further, there is substantially no undercut of the buried insulator layer beneath the NFET active area 34 or the boundary semiconductor region 36. The sidewalls of the NFET active area and the sidewalls of the exposed portion of the boundary semiconductor region 36 are substantially vertical and adjoin a substantially horizontal top surface of the buried insulator layer 20, which is coplanar with the interface between the buried insulator layer 20 and the NFET active area 34.

Figure 7:
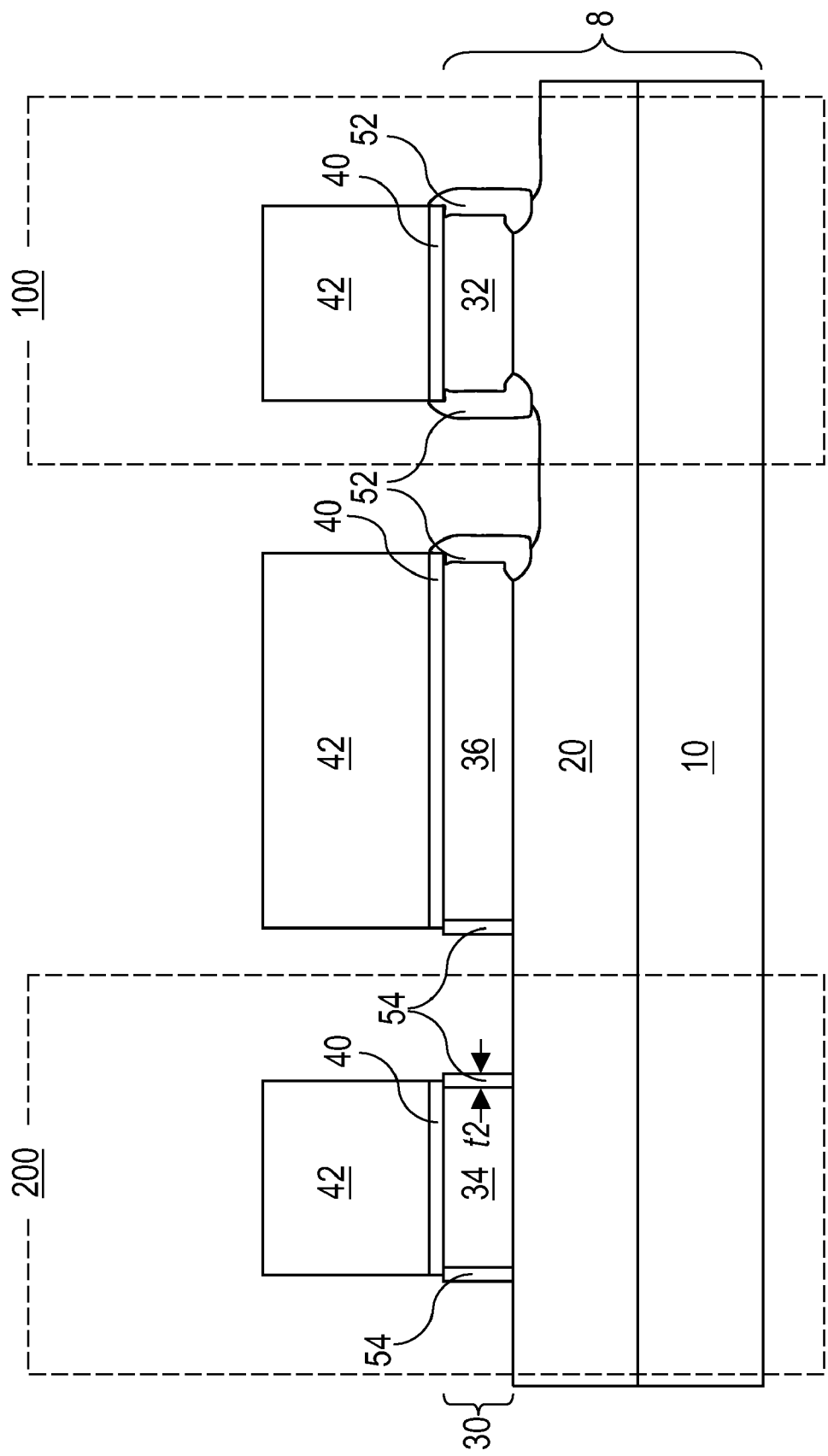

Referring to FIG. 7, the second photoresist 47 is removed, for example, by ashing. A suitable surface clean such as a wet clean may be performed as needed at this step. Thermal oxidation is performed to form a second thermal silicon oxide layer 54 on sidewalls of the NFET active area 34 and the exposed sidewalls of the boundary semiconductor region 36.

The second thermal silicon oxide layer 54 comprises thermal silicon oxide. In some embodiments in which the boundary semiconductor region 36 and the NFET active area 34 contains carbon and/or germanium at the low atomic concentration, the second thermal silicon oxide layer 54 may contain some carbon and/or germanium typically at an atomic concentration less than 5%. The thickness of the second thermal silicon oxide layer 54 on sidewalls of the NFET active area 32 and sidewalls of the boundary semiconductor region 36, which is herein referred to as a second thermal silicon oxide layer thickness t2, may be from about 0.5 nm to about 4 nm, and typically from about 1 nm to about 2 nm.

A portion of the second thermal silicon oxide layer 54 laterally surrounds the NFET active area 34 and applies a second laterally compressive stress to the NFET active area 34. Preferably, the second thermal silicon oxide layer thickness t2 is less than prior art thicknesses t0 for the prior art thermal silicon oxide layer 51 in the exemplary prior art semiconductor structure (See FIG. 1).

Preferably, during the formation of the second thermal silicon oxide layer 54, the pad layer 40 prevents growth of any thermal silicon oxide layer beneath the pad layer 40 as during the formation of the first thermal silicon oxide layer 52. The first thermal silicon oxide layer thickness t1 may marginally increase due to additional oxidation. In case any substantial increase can be triggered in the first thermal silicon oxide layer thickness t1 during the formation of the second thermal silicon oxide layer 54, the first thermal silicon oxide layer thickness t1 as measured after formation of the first thermal silicon oxide layer 52 at a processing step corresponding to FIG. 5 may be reduced so that the increased thickness at processing step corresponding to FIG. 7 matches a target thickness.

The portion of the second thermal silicon oxide layer 54 that laterally surrounds the NFET active area 34 is topologically homeomorphic to a torus, i.e., may be continually stretched and bent into a torus without forming or removing a singularity by creating or destroying a hole in the shape. The vertical cross-sectional area in a vertical cross-sectional view, such as FIG. 7, of the second thermal silicon oxide layer 54 is substantially rectangular, i.e., have the same lateral thickness irrespective of height from the top surface of the NFET active area 34 to the bottom surface of the NFET active area 34. Since the exposed portions of the buried oxide layer 20 in the NFET region 200 is not recessed, the second thermal silicon oxide layer 54 adjoins the buried insulator layer 20 at the height of the interface between the buried insulator layer 20 and the NFET active area 34.

Figure 8:
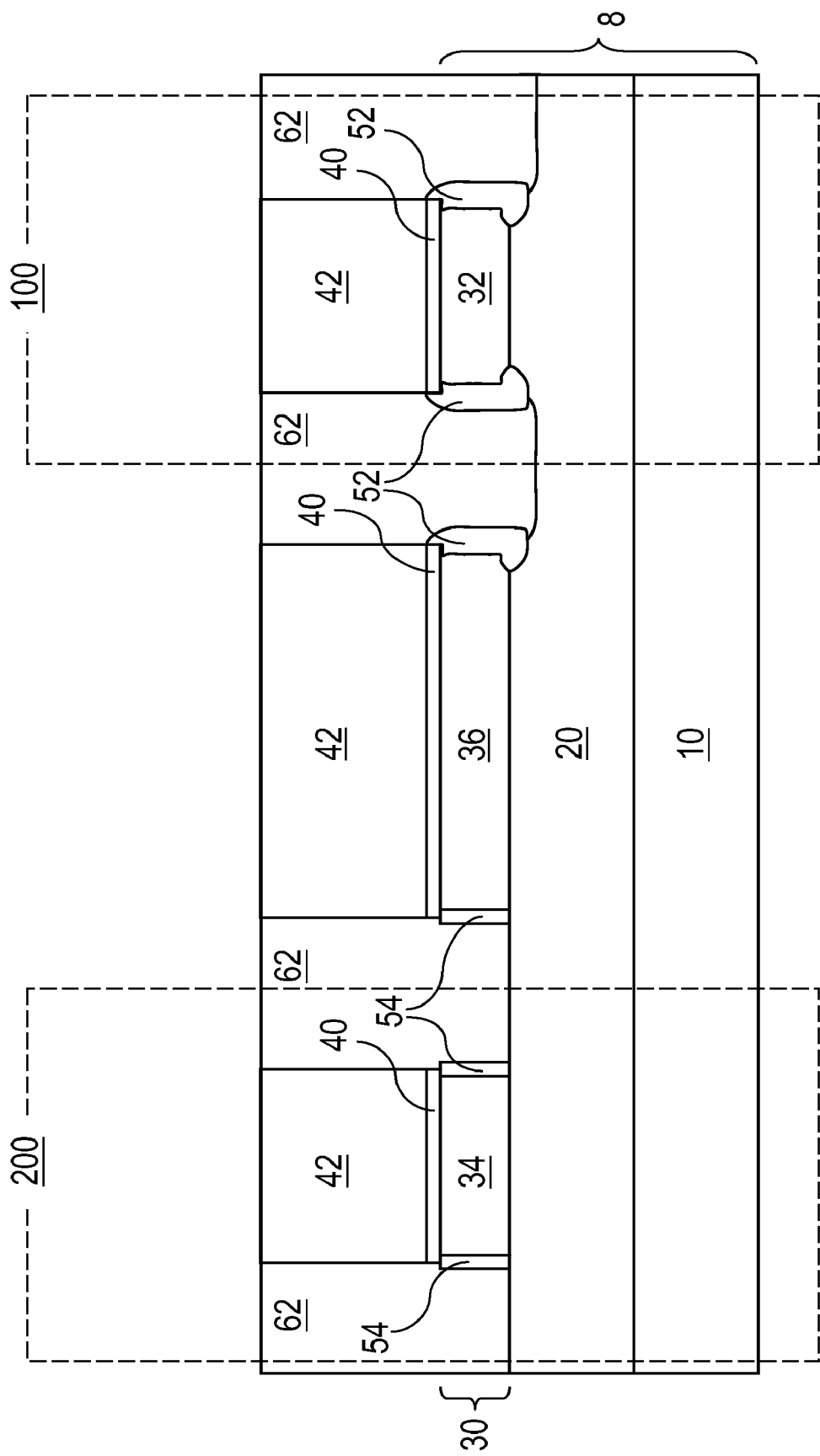

Referring to FIG. 8, a dielectric material is deposited between the outer surfaces of the first and second thermal silicon oxide layer (52, 54) and the sidewalls of the masking layer 42. The dielectric material is subsequently planarized, for example, by chemical mechanical planarization (CMP), a recess etch, or a combination thereof. In case chemical mechanical planarization is used, top surfaces of the masking layer 42 may be employed as a stopping layer.

The dielectric material may comprise a chemical vapor deposition (CVD) silicon oxide that may be deposited by plasma enhanced chemical vapor deposition (PECVD)), high density plasma chemical vapor deposition (HDPCVD), low pressure chemical vapor deposition (LPCVD), or rapid thermal chemical vapor deposition (RTCVD). The dielectric material may be doped with p-type dopants and/or n-type dopants, or alternatively, substantially undoped. The dielectric material may, or may not, comprise a liner material such as silicon nitride or silicon oxynitride. Preferably, the dielectric material comprises an undoped silicate glass (USG) deposited by high density plasma chemical vapor deposition (HDPCVD).

The planarized dielectric material having a top surface that is substantially coplanar with top surfaces of the masking layer 42 constitutes shallow trench isolation 62.

Figure 9:
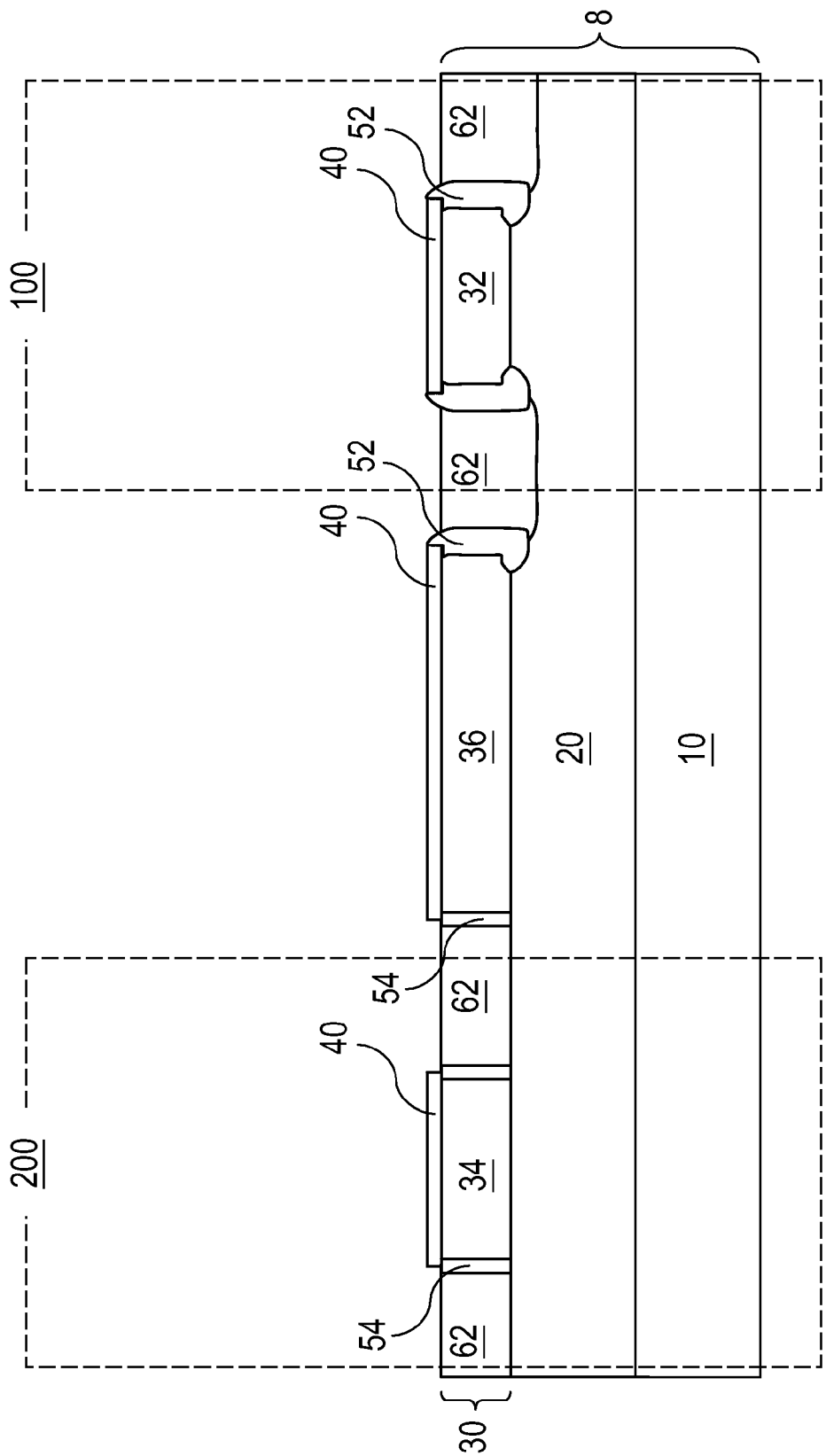

Referring to FIG. 9 the shallow trench isolation 62 is recessed to a height substantially coplanar with top surfaces of the PFET active area 32, the NFET active area 34, and the boundary semiconductor region 36, for example, by a wet etch or a reactive ion etch. Variations in which the top surfaces of the shallow trench isolation 62 is higher or lower than the top surfaces of the PFET active area 32 and the NFET active area 34 are explicitly contemplated herein. In case the reactive ion etch is used, the masking layer 42 may be employed as an etch mask. The masking layer 42 is subsequently removed, for example, by a wet etch. In case the masking layer 42 comprises silicon nitride, hot phosphoric acid may be employed in the wet etch.

Figure 10:
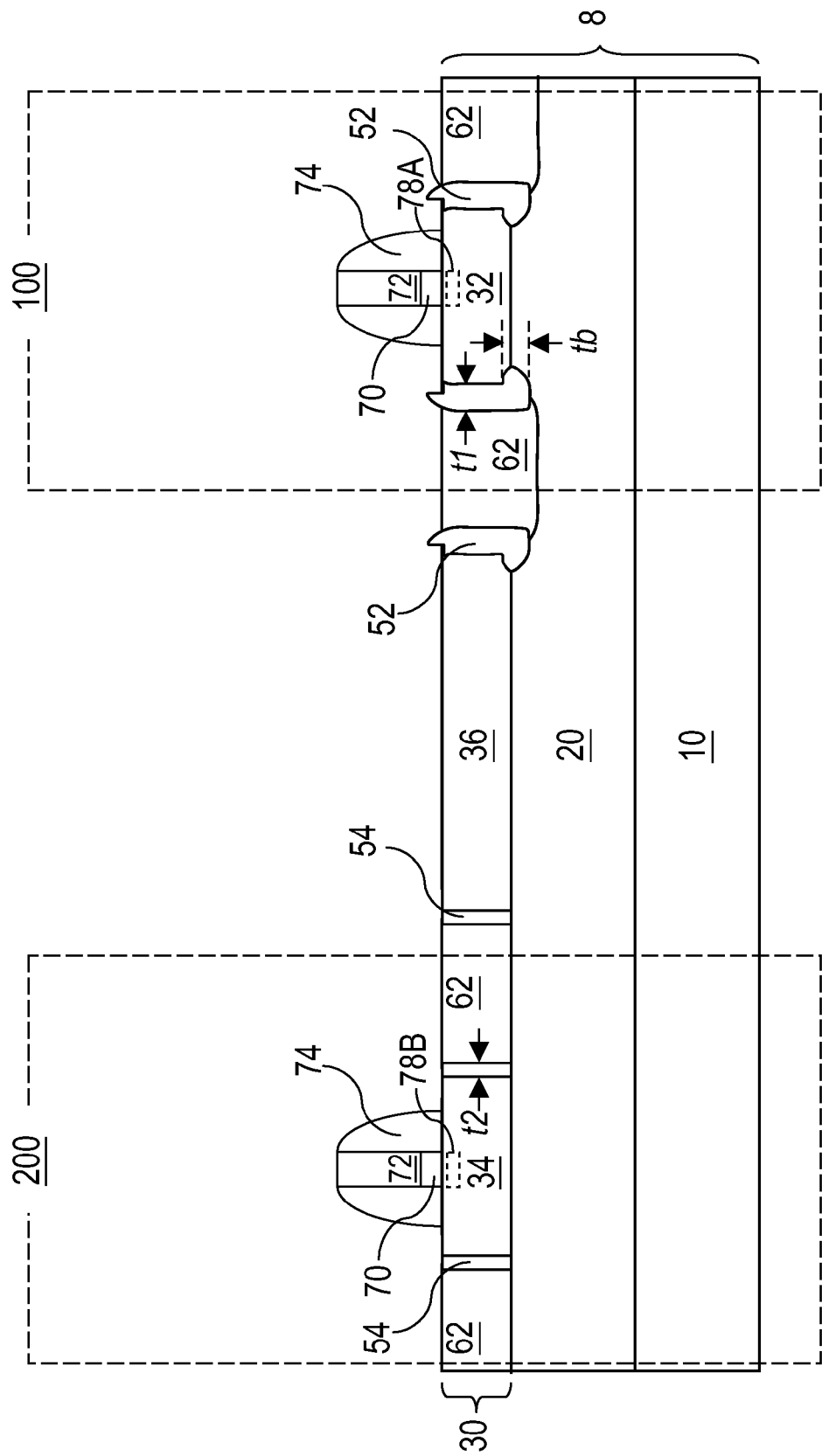

Referring to FIG. 10, the pad layer 40 is removed, for example, by a wet etching process. In case the pad layer 40 comprises silicon oxynitride, a,wet etch containing hydrofluoric acid and ethylene glycol may be employed. Gate dielectrics 70, gate conductors 72, and gate spacers 74 are formed as known in the art. Source and drain regions (not shown) are formed in the PFET active area 32 and the NFET active area 34. A PFET is formed in the PFET region 100 and an NFET is formed in the NFET region 200.

The PFET comprises a PFET channel 78A located in the PFET active area 32, which is laterally surrounded by the portion of the first thermal silicon oxide layer 52 located directly on the PFET active area 32, and as a consequence, the PFET channel 78A is under the first lateral compressive stress. Likewise, the NFET comprises an NFET channel 78B located in the NFET active area 34, which is laterally surrounded by the portion of the second thermal silicon oxide layer 54 located directly on the NFET active area 34, and as a consequence, the NFET channel 7813 is under the second lateral compressive stress. Since the thermal silicon oxide layer thickness t1 is greater than the second thermal silicon oxide layer thickness t2 and the L-shaped profile of the first thermal silicon oxide layer 52 enhances the first lateral compressive stress, the first lateral compressive stress is greater than the second compressive stress. Further, the first thermal silicon oxide layer thickness t1 and the second thermal silicon oxide layer thickness t2 may be independently tuned. Thus, the first thermal silicon oxide layer thickness t1 may be increased as much as other processing parameters allow, while the second thermal silicon oxide layer thickness t2 may be decreased as much as other processing parameters allow, to maximize the beneficial effects of a compressive lateral stress on the PFET and to minimize the deleterious effects of a compressive lateral stress on the NFET.

Figure 11:
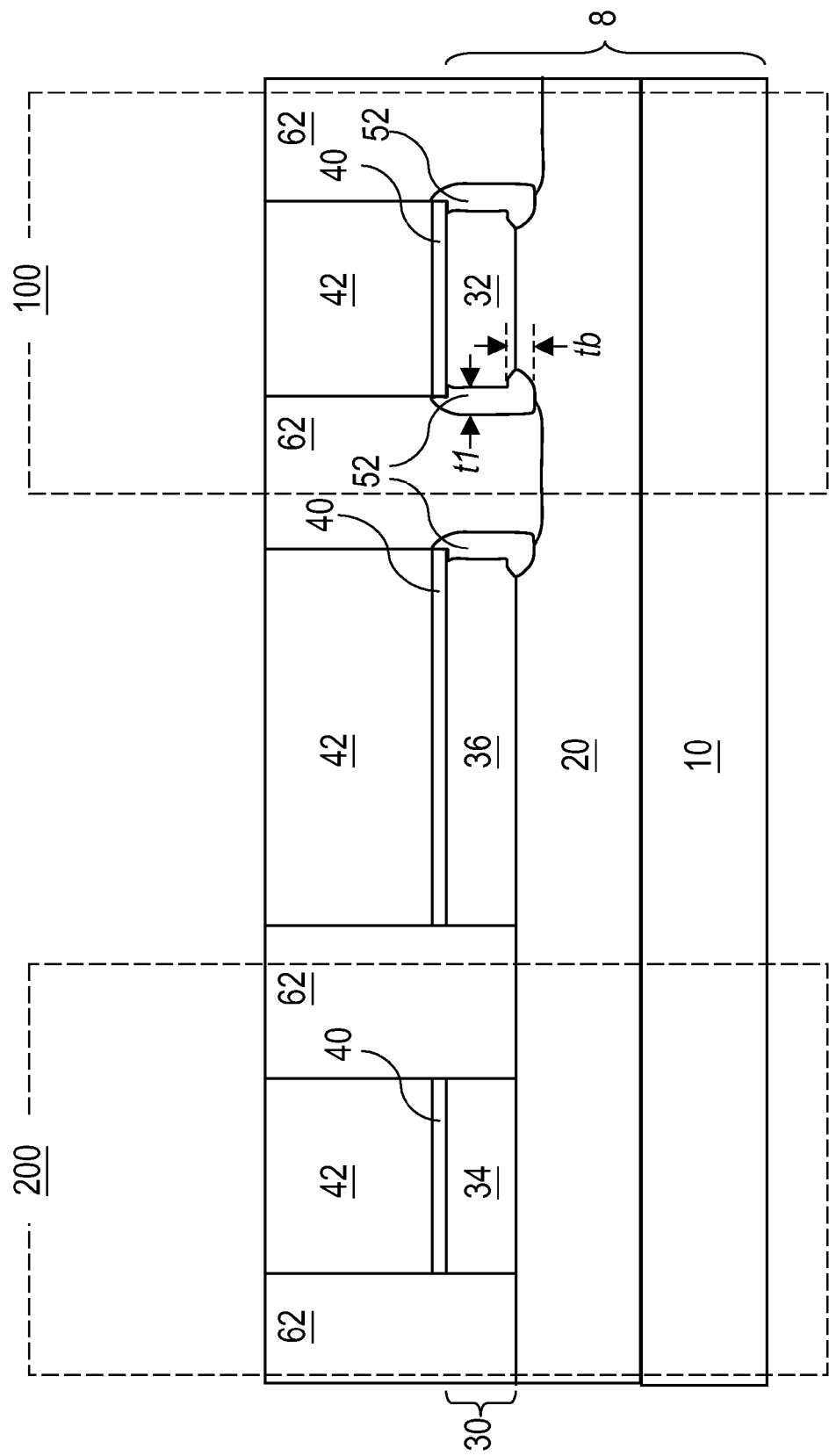
FIGS. 11-12 are sequential vertical cross-sectional views of a second exemplary semiconductor structure.

Referring to FIG. 11, a second exemplary semiconductor structure according to a second embodiment of the present invention is derived from the first exemplary semiconductor structure of FIG. 6 by removing the second photoresist 47, followed by deposition of a dielectric material and planarization to form shallow trench isolation 62 as in the processing step corresponding to FIG. 8. Formation of a second thermal silicon oxide layer is omitted in the second embodiment. Thus, the shallow trench isolation 62 abuts the sidewalls of the NFET active area 34 and the boundary semiconductor region 36.

Figure 12:
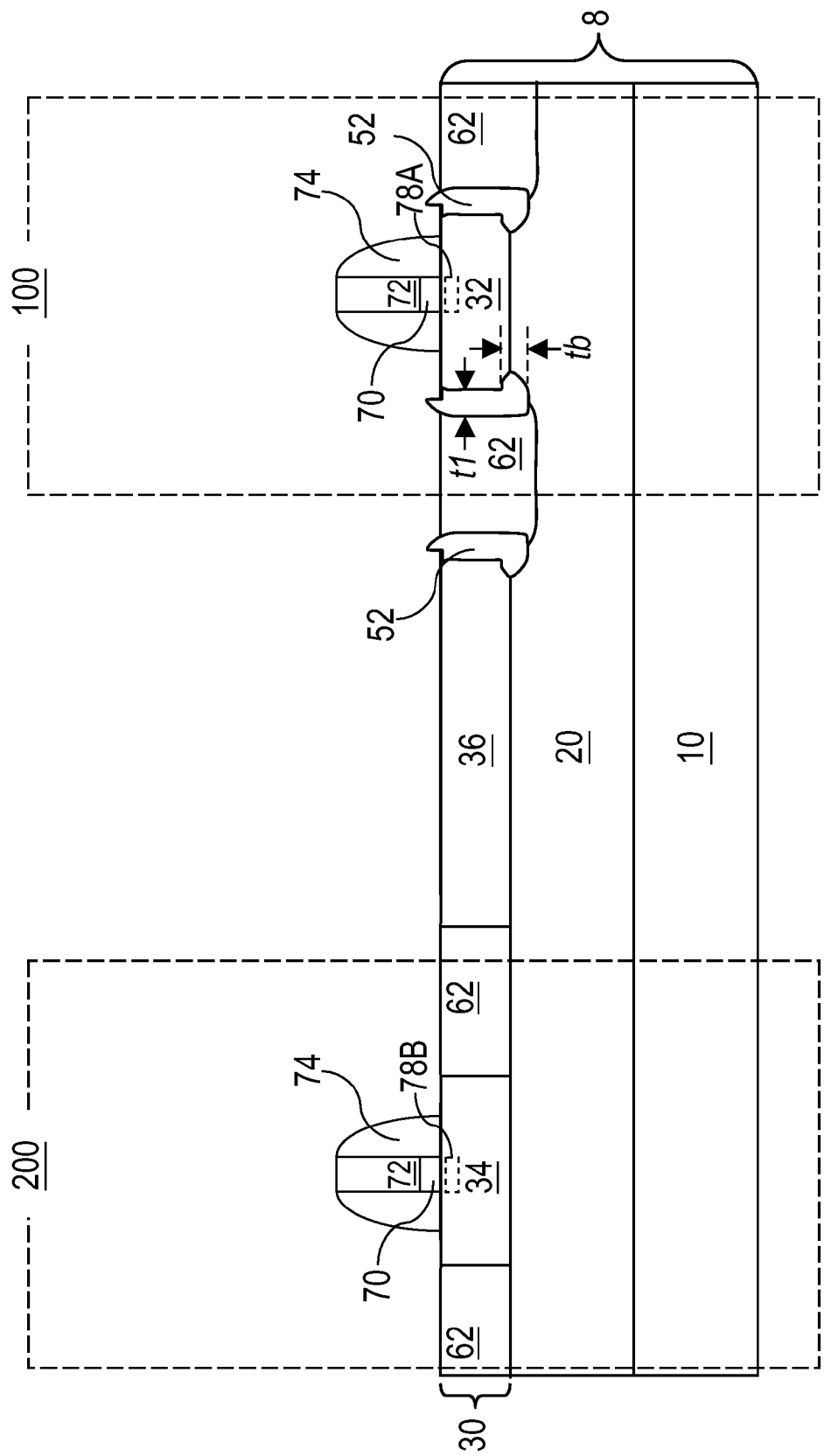

Other than the omission of the formation of the second thermal silicon oxide layer 54, the same processing steps are employed in the second embodiment as in the first embodiment. Referring to FIG. 12, the second exemplary semiconductor structure at a processing step corresponding to the processing step of FIG. 10 comprises a PFET having a PFET channel 78A and an NFET having an NFET channel 78B. Since the PFET channel 78A is located in the PFET active area 32, which is laterally surrounded by the portion of the first thermal silicon oxide layer 52 located directly on the PFET active area 32, the PFET channel 78A is under the first lateral compressive stress. However, the NFET channel 78B is located in the NFET active area 34, which is not surrounded by any thermal silicon oxide layer. Thus, a lateral compressive stress generated by a thermal silicon oxide layer is not present in the NFET channel 78B.

The first thermal silicon oxide layer thickness t may be increased as much as other processing parameters allow without adversely affecting performance of the NFET. The beneficial effects of a compressive lateral stress on the PFET can be maximized without any deleterious effects on the NFET.

Figure 13:
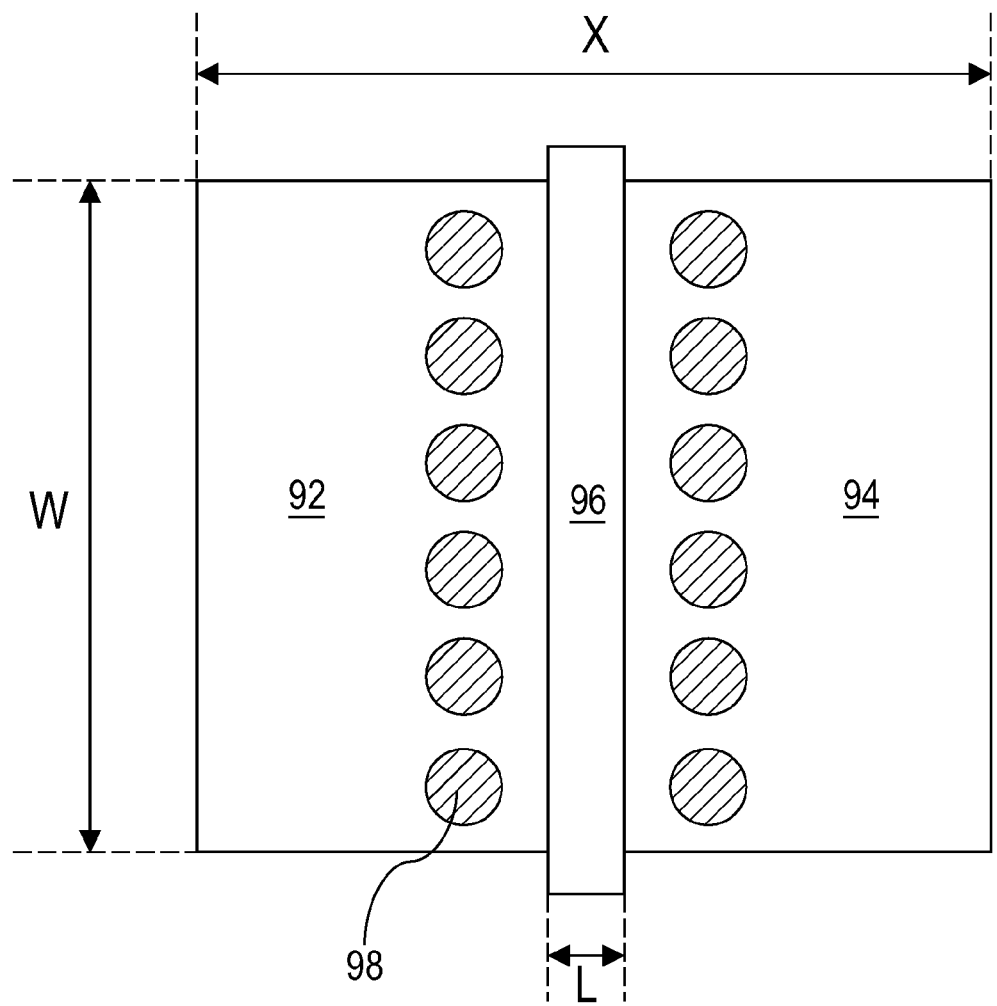
FIG. 13 is a layout of test structures employed for generation of the data in FIGS. 14 and 15.

Referring to FIG. 13, a layout of test structures employed for generation of data comparing the performance of the prior art exemplary semiconductor structure (See FIG. 1) and the second exemplary semiconductor structure of the present invention (See FIG. 12) is shown. The layout comprises a semiconductor region containing a source 92 and a drain 94 and having a semiconductor region width W and a semiconductor region length X, which is equal to 3 μm. The layout further comprises a gate 96 having a gate length L, which is equal to 60 nm. The semiconductor region width W is varied between 0.4 μm and 50 μm. This layout is employed in comparing the magnitudes of PFET on-current and NFET on-current between the prior art exemplary semiconductor structure and the second exemplary semiconductor structure.

Figure 14:
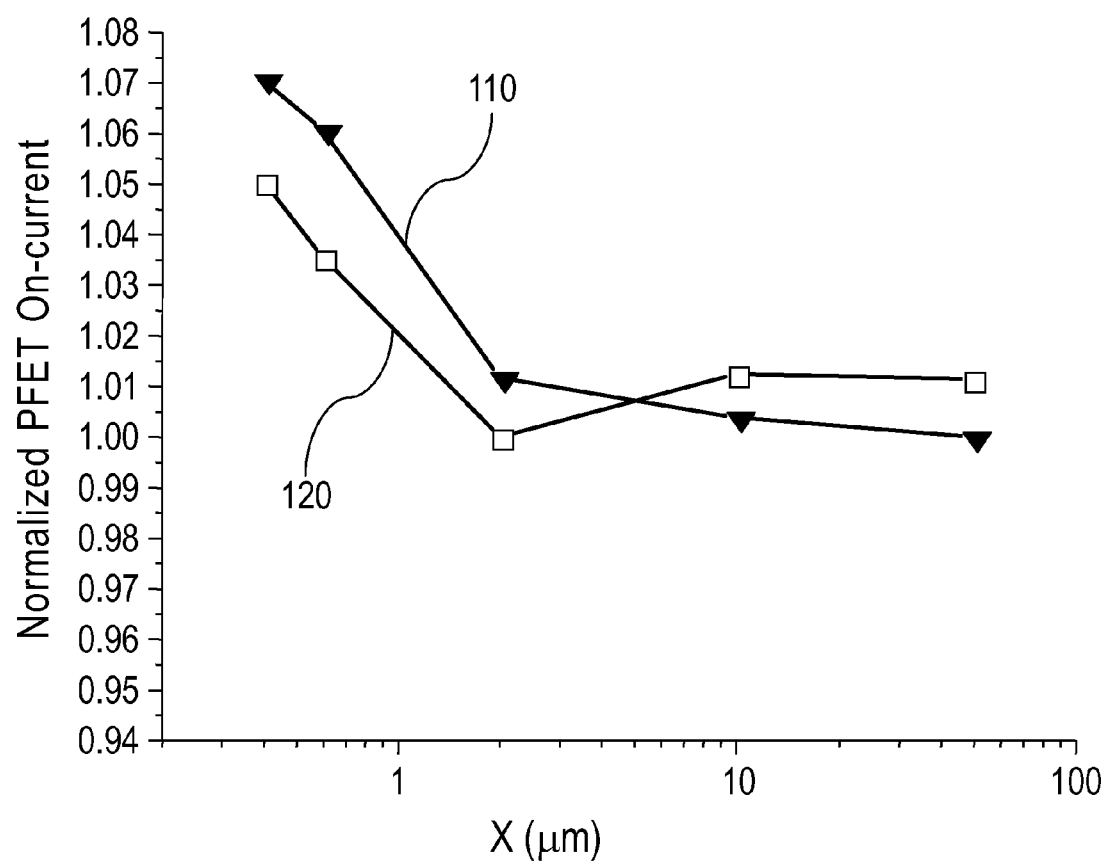
FIG. 14 is a comparison between the on-current of the PMOSFETs according to the present invention and the on-current of the PMOSFETs having the exemplary prior art structure.

Referring to FIG. 14, normalized PFET on-currents, i.e., PFET on-currents per unit width, are shown for PFETs having the prior art exemplary structure and the second exemplary semiconductor structure. A first normalized PFET on-current curve 110 corresponding to a PFET of the second exemplary semiconductor structure displays higher on-current for semiconductor region widths W less than about 5 ρm compared to a second normalized PFET on-current curve 120 corresponding to a PFET of the exemplary prior art semiconductor structure of FIG. 1.

Figure 15:
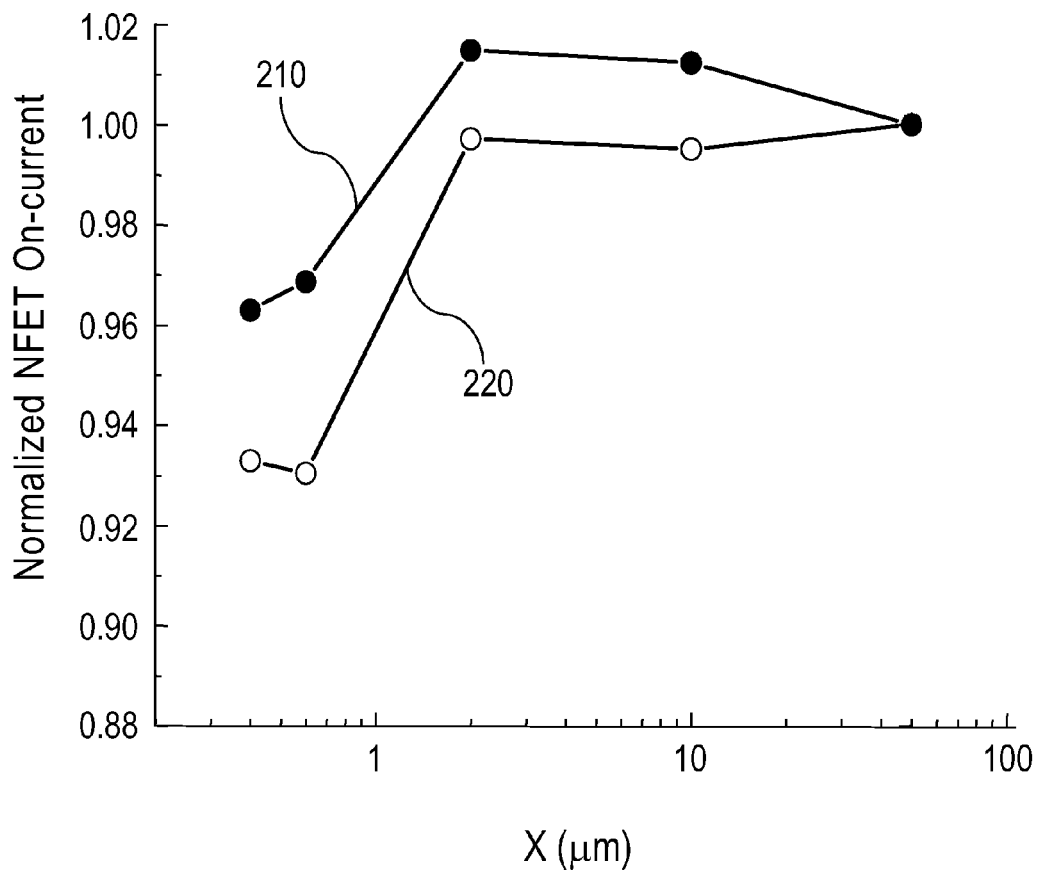
FIG. 15 is a comparison between the on-current of the NMOSFET according to the second embodiment of the present invention and the on-current of NMOSFETs having the exemplary prior art structure.

Referring to FIG. 15, normalized NFET on-currents, i.e., NFET on-currents per unit width, are shown for NFETs having the prior art exemplary structure and the second exemplary semiconductor structure. A first normalized NFET on-current curve 210 corresponding to an NFET of the second exemplary semiconductor structure displays less degradation of the on-current per unit value of the semiconductor region width W for all values of the semiconductor region width W up to 10 μm compared to a second normalized NFET on-current curve 220 corresponding to an NFET of the exemplary prior art semiconductor structure of FIG. 1.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
a p-type field effect transistor (PFET) including a PFET active area, wherein said PFET active area contains a PFET channel and is located directly on a buried insulator layer of a semiconductor-on-insulator substrate;
an n-type field effect transistor (NFET) including an NFET active area, wherein said NFET active area contains an NFET channel and is located directly on said buried insulator and is disjoined from said PFET active area;
a thermal silicon oxide layer located directly on sidewalls and a bottom peripheral surface of said PFET active area, wherein a portion of said thermal silicon oxide layer on said sidewall of said PFET active area has a first thickness; and
another thermal silicon oxide layer located directly on sidewalls of said NFET active area, wherein a portion of said thermal silicon oxide layer on said sidewall of said NFET active area has a second thickness, and wherein said first thickness is greater than said second thickness.

2. The semiconductor structure of claim 1, wherein a vertical cross-sectional area of said thermal silicon oxide layer is L-shaped.

3. The semiconductor structure of claim 1, further comprising shallow trench isolation comprising a dielectric material and abutting said thermal silicon oxide layer and said another thermal silicon oxide layer.

4. The semiconductor structure of claim 1, wherein said buried insulator layer has a recessed portion having a recessed surface extending from said bottom peripheral surface of said PFET active area to a recess depth below an interface between said PFET active area and said buried insulator layer, and wherein said thermal silicon oxide layer abuts a portion of said recessed surface.

5. The semiconductor structure of claim 4, wherein said top semiconductor layer comprises silicon and has a thickness from about 5 nm to about 30 nm, and said recess depth is from about 1 nm to about 5 nm, and said thermal silicon oxide layer extends from a sidewall of said PFET active area toward said PFET active area by about 0.5 nm to about 6 nm along an interface between said buried insulator layer and said PFET active area, said first thickness from about 1 nm to about 8 nm, and said second thickness is from about 0.5 nm to about 4 nm.

6. The semiconductor structure of claim 1, wherein said thermal silicon oxide layer applies a first laterally compressive stress on said PFET channel and said another thermal silicon oxide layer applies a second laterally compressive stress on said NFET channel, wherein the magnitude of said first laterally compressive stress is greater than the magnitude of said second laterally compressive stress.

7. A semiconductor structure comprising:
a p-type field effect transistor (PFET) including a PFET active area, wherein said PFET active area contains a PFET channel and is located directly on a buried insulator layer of a semiconductor-on-insulator substrate;
an n-type field effect transistor (NFET) including an NFET active area, wherein said NFET active area contains an NFET channel and is located directly on said buried insulator and is disjoined from said PFET active area;
a thermal silicon oxide layer located directly on sidewalls and a bottom peripheral surface of said PFET active area; and
shallow trench isolation comprising a dielectric material and laterally abutting said thermal silicon oxide layer and sidewalls of said NFET active area.

8. The semiconductor structure of claim 7, wherein a vertical cross-sectional area of said thermal silicon oxide layer is L-shaped.

9. The semiconductor structure of claim 7, wherein said buried insulator layer has a recessed portion having a recessed surface extending from said bottom peripheral surface of said PFET active area to a recess depth below an interface between said PFET active area and said buried insulator layer, and wherein said thermal silicon oxide layer abuts a portion of said recessed surface.

10. The semiconductor structure of claim 9, wherein said top semiconductor layer comprises silicon and has a thickness from about 5 nm to about 30 nm, and said recess depth is from about 1 nm to about 5 nm, and said thermal silicon oxide layer extends from a sidewall of said PFET active area toward said PFET active area by about 0.5 nm to about 6 nm along an interface between said buried insulator layer and said PFET active area, and a portion of said thermal silicon oxide layer on said sidewall of said PFET active area has a thickness from about 1 nm to about 8 nm.

11. The semiconductor structure of claim 9, wherein a portion of said thermal silicon oxide layer between said buried insulator layer and said PFET active area has a bottom oxide thickness, and said first thickness is substantially the same as said bottom oxide thickness.

12. The semiconductor structure of claim 7, wherein said thermal silicon oxide layer applies a laterally compressive stress on said PFET channel.

\* \* \* \* \*